United States Patent
Nakamura et al.

(10) Patent No.: US 7,372,119 B2
(45) Date of Patent: May 13, 2008

(54) CROSS-SHAPED HALL DEVICE HAVING EXTENSIONS WITH SLITS

(75) Inventors: Masahiro Nakamura, Atsugi (JP); Akiko Mino, Machida (JP)

(73) Assignees: Asahi Kasei Microsystems Co., Ltd., Tokyo (JP); Asahi Kasei Electronics Co., Ltd., Tokyo (JP)

( * ) Notice: Subject to any disclaimer, the term of this patent is extended or adjusted under 35 U.S.C. 154(b) by 0 days.

(21) Appl. No.: 10/491,276

(22) PCT Filed: Sep. 30, 2002

(86) PCT No.: PCT/JP02/10164

§ 371 (c)(1),
(2), (4) Date: Mar. 31, 2004

(87) PCT Pub. No.: WO03/032410

PCT Pub. Date: Apr. 17, 2003

(65) Prior Publication Data

US 2004/0251507 A1 Dec. 16, 2004

(30) Foreign Application Priority Data

Oct. 1, 2001 (JP) ............................. 2001-305715

(51) Int. Cl.
*H01L 43/06* (2006.01)
(52) U.S. Cl. ............................. 257/427; 257/E43.003
(58) Field of Classification Search ........ 257/421–427, 257/E43.003; 438/48
See application file for complete search history.

(56) References Cited

U.S. PATENT DOCUMENTS 3,082,507 A * 3/1963 Kuhrt et al. .................. 438/48

(Continued)

FOREIGN PATENT DOCUMENTS

EP 0 548 375 A1 6/1993

(Continued)

OTHER PUBLICATIONS

Popović, R.S., "Hall Effect Devices Magnetic Sensors and Characterization of Semiconductors", pp. 70-73, 156-166, and 183-187, (1991).

(Continued)

*Primary Examiner*—Lynne Gurley
*Assistant Examiner*—Andrew O. Arena
(74) *Attorney, Agent, or Firm*—Finnegan, Henderson, Farabow, Garrett & Dunner, LLP

(57) ABSTRACT

A Hall device of the present invention includes a cross-shaped magnetometric sensing surface, a pair of power terminal portions and a pair of output terminal portions. The surface is formed of a rectangular and mutually opposed extensions provided on each side of the rectangular. The pair of power terminal portions is provided on a pair of the opposed extensions at the surface. The pair of output terminal portions is provided on another pair of the opposed extensions at the surface. Slits extending in each opposed direction completely split the power portions and the output portions and in partway split each extension at the surface, and each of the slits is provided with a separation layer of an insulator. An outline formed of the surface, the power portions and the output portions is quadrature-symmetrical with the center. The Hall device of this structure is highly sensitive to a magnetic field.

6 Claims, 18 Drawing Sheets

U.S. PATENT DOCUMENTS

| | | | |
|---|---|---|---|
| 4,195,305 A | 3/1980 | Moon | |
| 4,236,165 A | 11/1980 | Kawashima et al. | |
| 4,668,100 A | 5/1987 | Murakami et al. | |
| 4,690,714 A | 9/1987 | Li | |
| 4,782,375 A | 11/1988 | Popovic | |
| 4,987,467 A | 1/1991 | Popovic | |
| 5,184,106 A | 2/1993 | Partin et al. | |
| 5,198,795 A | 3/1993 | Shibasaki et al. | |
| 5,385,864 A | 1/1995 | Kawasaki et al. | |
| 5,430,310 A | 7/1995 | Shibasaki et al. | |
| 5,453,727 A | 9/1995 | Shibasaki et al. | |
| 5,491,461 A | 2/1996 | Partin et al. | |
| 5,543,727 A | 8/1996 | Shibasaki et al. | |
| 5,621,320 A | 4/1997 | Yokotani et al. | |
| 5,804,475 A | 9/1998 | Meyer et al. | |
| 5,883,564 A | 3/1999 | Partin | |
| 6,100,546 A | 8/2000 | Major et al. | |
| 6,590,389 B1 | 7/2003 | Shibasaki et al. | |
| 6,630,882 B1 | 10/2003 | Heremans et al. | |
| 6,809,514 B2 | 10/2004 | Ashley et al. | |
| 6,861,679 B2 | 3/2005 | Otsuka et al. | |
| 2001/0055002 A1 | 12/2001 | Endo | |
| 2002/0009192 A1 | 1/2002 | Nakamura | |

FOREIGN PATENT DOCUMENTS

| | | |
|---|---|---|
| EP | 0 810 544 A2 | 12/1997 |
| EP | 1 124 271 A1 | 8/2001 |
| JP | 55-132066 | 10/1980 |
| JP | 59-048970 | 3/1984 |
| JP | 62-174984 | 7/1987 |
| JP | 02-272782 | 11/1990 |
| JP | 03-288483 | 12/1991 |
| JP | 4-279071 | 10/1992 |
| JP | 05-297084 | 11/1993 |
| JP | 06-077556 | 3/1994 |
| JP | 06-125122 | 5/1994 |
| JP | 06-224488 | 8/1994 |
| JP | 7-193297 | 7/1995 |
| JP | 7-249805 | 9/1995 |
| JP | 07-283390 | 10/1995 |
| JP | 08-088423 | 4/1996 |
| JP | 08-204251 | 8/1996 |
| JP | 08-242027 | 9/1996 |
| JP | 09-116207 | 5/1997 |
| JP | 09-203748 | 8/1997 |
| JP | 09-219547 | 9/1997 |
| JP | 10-233539 | 2/1998 |
| JP | 3069545 | 2/1998 |
| JP | 10-074308 | 3/1998 |
| JP | 2793440 | 6/1998 |
| JP | 11-183579 | 7/1999 |
| JP | 2000-35469 | 2/2000 |
| JP | 2000-183424 | 6/2000 |
| JP | 2001-352369 | 12/2001 |
| KR | 20010058109 | 5/2001 |

OTHER PUBLICATIONS

European Supplementary Search Report for European Patent Application No. 03700583.2 dated Jun. 18, 2007.

N. Kuze et al., "Molecular beam epitaxial growth of InAs/AlGaAsSb deep quantum well structures on GaAs substrates,," J. Vac. Sci. Technol. B 16(5), Sep./Oct. 1998, American Vacuum Society, pp. 2644-2649.

European Search Report and Communication for European Patent Application No. 07008331.6, dated Jul. 3, 2007.

* cited by examiner

CROSS-SHAPED HALL DEVICE HAVING EXTENSIONS WITH SLITS

TECHNICAL FIELD

The present invention relates to a Hall device and a magnetic sensor, and more specifically to a highly sensitive Hall device and a magnetic sensor capable of providing sufficient offset and obtaining a high Hall voltage with a low drive voltage.

BACKGROUND ART

A Hall device has a broad scope of application and has been used, for example, in a non-contact type rotation detecting sensor for a brushless motor employed with a VTR, CD-ROM drive or the like, and in a current flow measuring apparatus.

A currently proposed Hall device for detecting magnetic field which is particularly employed in a magnetic sensor has a variety of shapes. Those include a rectangular shape and a clover shape, and a rectangular or a Van der Pauw type Hall device is typically used when measuring the polarity, density and mobility of carriers within a conductive sample.

FIG. 1 is a schematic view illustrating a structure of a Hall device which is often used for physics experiments. For enhancing the magnetic field detecting sensitivity, the Hall device is provided with a rectangular magnetometric sensing surface 110 having a distance L between a pair of power terminals and a distance W between a pair of Hall voltage output terminals. The opposed short sides are provided with a power terminal $C_1$ 111 and a power terminal $C_2$ 112, respectively. The opposed long sides are provided with a Hall voltage output terminal $S_1$ 113 and a Hall voltage output terminal $S_2$ 114, respectively.

For the Hall device for detecting a magnetic field, offset compensation is particularly essential. Thus, such a device known as a symmetry-type Hall device has been mainly employed, which attains offset compensation by alternately exchanging the positions of the power terminals and the Hall voltage output terminals (SCM: Spinning Current Method).

The "symmetry-type Hall device" herein refers to a Hall device which includes a rectangular or substantially cross-shaped magnetometric sensing surface and power terminals and Hall voltage output terminals. One of an opposed pair of the corners or sides of the magnetometric sensing surface is provided with a pair of the power terminals and the other of the pair is provided with another pair of the power terminals. One of the other opposed pair of the corners or sides of the magnetometric sensing surface is provided with a pair of the Hall voltage output terminals and the other of the other pair is provided with another pair of the Hall voltage output terminals. Additionally, the geometrical shape of the Hall device is not altered when the positions of the power terminals and the Hall voltage output terminals are exchanged. In other words, the outline of the symmetry-type Hall device is quadrature-symmetrical with its center.

FIG. 2 illustrates the structure of the symmetry-type Hall device. A rectangular magnetometric sensing surface 120 is equipped with power terminals $C_1$ 121, $C_2$ 122 and Hall voltage output terminals $S_1$ 123, $S_2$ 124 on its four corners. The power terminals and Hall voltage output terminals are opposed.

This symmetry-type Hall device is one of the most widely used Hall devices for detecting magnetic field due to an extremely simple configuration and an easiness of manufacturing.

Additionally, a cross-shaped Hall device is one of the known symmetry-type Hall devices.

FIG. 3 schematically illustrates a structure of a cross-shaped Hall device created by Popovic et al. Four extensions at a cross-shaped magnetometric sensing surface 130 are provided with power terminals $C_1$ 131 and $C_2$ 132, and with Hall voltage output terminals $S_1$ 133 and $S_2$ 134, respectively mutually opposed.

When the Hall device is formed on a Si substrate, the terminals and the magnetometric sensing surface of the Hall device are freely structured since fine process on the substrate is easily performed. For example, there are disclosed a vertical type Hall device for detecting magnetic field in a parallel direction to a substrate surface in Japanese Patent Application Publication No. 63-055227 (1988), a lateral type Hall device for detecting magnetic field in a perpendicular direction to a substrate in Japanese Patent Application Laying-open No. 7-249805 (1995), a device which accomplishes offset compensation not by the SCM but by dividing output terminals to connect to an offset compensation circuit in Japanese Patent Application Laying-open No. 11-183579 (1999), and a device provided with a configuration and a circuit for reducing variations in offset and sensitivity in Japanese Patent Application Laying-open No. 7-193297 (1995).

The above symmetry-type Hall devices offer an advantage in that they are capable of attaining offset compensation by the SCM. However, such Hall devices have a drawback of providing low sensitivity to detecting magnetic field compared with a rectangular Hall device.

The Hall voltage produced between two Hall voltage output terminals of a constant-current-drive Hall device depends on its configuration, and is calculated according to the following equation:

$$V_H = G \cdot r_H \cdot I \cdot B_Z / ned \qquad (1)$$

where I, $B_Z$, n, and e represent a current flowing between the power terminals, an applied magnetic flux density, a carrier density, and an unit charge, respectively, and d, G, and $r_H$ represent a thickness of layer in which current flows, an geometrical factor, and a Hall scattering factor, respectively.

FIG. 4, which is transferred from R. S. Popovic, "Hall Effect Device", shows the relationship between the ratio of the distance L between the power terminals to the distance W between the Hall voltage output terminals (L/W ratio) and the geometrical factor G of the rectangular Hall device. The longer the distance L between the power terminals is than the distance W between the Hall voltage output terminals, the larger the geometrical factor G becomes. The geometrical factor G is approximately 1 when L>3W. However, the geometrical factor G is only about 0.6 when L=W, which shows a rectangular shape corresponding to the configuration of the symmetry-type Hall device, depending on the applied magnetic flux density. This means that the symmetry-type rectangular Hall device loses approximately 40% of magnetic field detecting sensitivity due to its shape.

DISCLOSURE OF THE INVENTION

An object of the present invention is to solve the aforementioned problem by providing a highly sensitive Hall device in detecting a magnetic field and a magnetic sensor capable of providing sufficient offset and obtaining a high Hall voltage with a low drive voltage.

The inventors of the present invention investigated an effect of the L/W ratio on a potential distribution in the magnetometric sensing surface through simulations in order to more specifically find out a cause for the decrease in the magnetic field detecting sensitivity of the rectangular Hall device or the Hall device having short intervals between the terminals, i.e. the physical significance of the geometrical factor G. Hereinafter described are the results obtained from the simulations.

In the simulations, we assumed an n-type Si Hall device includes a pair of opposed power terminals and a pair of opposed Hall voltage output terminals at the magnetometric sensing surface, which has a carrier density of $1.5E16/cm^3$ at the magnetometric sensing surface and a carrier density of $5.0E20/cm^3$ at the terminals. We obtained the solution by simultaneously establishing a Poison's equation, equations of continuity for electron and hall, and a governing equation including the factors of carrier density diffusion, drift due to an electric field and the Lorentz force effect on condition that a magnetic flux density of 1T perpendicular to the surface of the substrate is applied.

Referred to first is a simulation in which the Hall voltage output terminals are relatively small-sized and their effect on the potential distribution in the magnetometric sensing surface can be ignored.

FIG. 5 shows a potential distribution in the magnetometric sensing surface as a result of a simulation in which a Hall device is assumed to have a rectangular shape of L>3W. In the Hall device of this shape, due to the length L being sufficiently larger than the length W, equipotential surfaces about the center of the magnetometric sensing surface are parallel and directed uniformly in an oblique direction.

This occurs because the Lorentz force operating in a magnetic field causes a non-uniformity in an electron distribution in the magnetometric sensing surface, in which distribution of an electron density in the lower area from the center is denser and in the upper area thinner. Thus, due to the non-uniformity, the Hall electric field 151 is generated toward the Hall voltage output terminals. A composite field of the Hall electric field 151 and an electric field 152 between the power terminals forms the obliquely directed potential distribution illustrated in FIG. 5. Under this condition, the maximum Hall voltage is produced when the Lorentz force in the magnetic field and the Hall electric field are balanced about the center of the magnetometric sensing surface and a movement of carriers (electrons) is in a parallel direction to an opposing direction of the power terminals.

FIG. 6 illustrates a potential distribution in the magnetometric sensing surface as a result of a simulation in which a symmetry-type Hall device is assumed to have a rectangular magnetometric sensing surface with L=W. The figure shows equipotential surfaces at each $10^{-2}V$.

According to the Hall device of this shape, the potentials in the magnetometric sensing surface are not sufficiently directed obliquely. Consequently, a direction of the movement of the carriers is oblique about the center of the magnetometric sensing surface.

This occurs from the fact that, while a velocity vector of the carriers due to the electric field is directed toward the power terminals because of a voltage uniformity at the terminal surfaces of the power terminals, the Lorentz force acting on the carriers in the magnetic field causes the carriers to be bent at the degree of the Hall angle and emitted from the power terminals. More specifically, since the Lorentz force acts on the carriers moving within the magnetometric sensing surface in a direction of an outer product of the magnetic field and the velocity vector of the carriers, a contribution of the obliquely moving carriers to the Hall voltage is lowered to the degree of the inclination angle. In a region where the carriers are sufficiently distant from the power terminal surfaces, an electron distribution for generating an electric field sufficient to direct the carriers parallel to the direction of the power terminals can be formed. However, when the distance L between the power terminals is relatively short, the potential distribution is not directed sufficiently oblique and thus the carrier movement direction is oblique at the central area of the magnetometric sensing surface. As a result, the Hall voltage drops.

Described next is a simulation in which the Hall voltage output terminals are comparatively large-sized and their effect on the potential distribution in the magnetometric sensing surface cannot be ignored.

FIG. 7 illustrates a potential distribution in a magnetometric sensing surface of a cross-shaped Hall device as a result of a simulation. The figure shows equipotential surfaces at each $10^{-2}$ V obtained by the simulation. Four extensions at a cross-shaped magnetometric sensing surface 170 are provided with power terminals $C_1$171 and $C_2$172, and with Hall voltage output terminals $S_1$173 and $S_2$174, respectively mutually opposed. The power terminals and Hall voltage output terminals are opposed. The potential distribution shown in the figure is obtained on condition that a current flows from a power terminal $C_1$171 to a power terminal $C_2$172 and a vertical magnetic field with respect to the paper surface is applied.

FIG. 8 illustrates a potential distribution in a magnetometric sensing surface of a cross-shaped Hall device having no Hall voltage output terminal as a result of a simulation. A pair of opposed extensions of four extensions at a cross-shaped magnetometric sensing surface 180 is equipped with a power terminal $C_1$181 and $C_2$182. The potential distribution shown in the figure is obtained on condition that a current flows from a power terminal $C_1$181 to a power terminal $C_2$182 and a vertical magnetic field with respect to the paper surface is applied.

Comparing the potential distributions in the magnetic sensitive surfaces as shown in FIGS. 7 and 8, it is found that the carrier velocity in the Hall device having the Hall voltage output terminals decreases in the neighborhood of the Hall voltage output terminals because the Hall voltage output terminal surfaces are equipotential. The operating Lorentz force is weakened according to the decrease in the carrier velocity and thus the lower Hall voltage is produced.

As can be seen from the aforementioned results, it is desirable, in order to produce high Hall voltage, to locate the Hall voltage output terminals away from the region where the principal current flows, or to narrow the width of the Hall voltage output terminals. However, when a conventional cross-shaped Hall device is configured with Hall voltage output terminals away from the region where the principal current flows, it inevitably becomes large-sized and requires a higher drive voltage.

An object of the present invention is achieved by providing a Hall device comprising on a substrate, a cross-shaped magnetometric sensing surface formed of a rectangular portion and mutually opposed extensions provided on each side of the rectangular portion, a pair of power terminal portions for inputting a current/voltage provided on a pair of the opposed extensions at the cross-shaped magnetometric sensing surface, a pair of output terminal portions for outputting Hall voltage provided on another pair of the opposed extensions at the cross-shaped magnetometric sensing surface, and slits extending in each opposed direction and for completely splitting the power terminal portions and the output terminal portions and for in partway splitting each extension at the cross-shaped magnetometric sensing surface, each of the slits being provided with a separation layer of an insulator.

The Hall device of the present invention is preferably structured such that (1) an outline formed of the cross-shaped magnetometric sensing surface and the power terminal portions and the output terminal portions is quadrature-symmetrical with the center, that (2) the slits completely split the power terminal portions and the output terminal portions, and in partway split the each extension at the cross-shaped magnetometric sensing surface, respectively at regular intervals, and that (3) a ratio of a length of a border to a distance between two midpoints is no less than ⅓ and no greater than 3, the border bounding the slit and the extension at the magnetometric sensing surface, one of the midpoints being a midway point between mutually opposed extensions split by the slits at the magnetometric sensing surface with the rectangular portion located between the extensions, and the other of the midpoints being a midway point between mutually opposed extensions split by the slits at the magnetometric sensing surface with the rectangular portion located between the extensions.

Another object of the present invention is achieved by providing a magnetic sensor comprising a Hall device comprising on a substrate, a cross-shaped magnetometric sensing surface formed of a rectangular portion and mutually opposed extensions provided on each side of the rectangular portion, a pair of power terminal portions for inputting a current/voltage provided on a pair of the opposed extensions at the cross-shaped magnetometric sensing surface, a pair of output terminal portions for outputting Hall voltage provided on another pair of the opposed extensions at the cross-shaped magnetometric sensing surface, and slits extending in each opposed direction and for completely splitting the power terminal portions and the output terminal portions and for in partway splitting each extension at the cross-shaped magnetometric sensing surface, respectively at regular intervals, each of the slits being provided with a separation layer of an insulator, and an adder including a differential amplifier, the adder being connected to the power terminal portions of the Hall device, wherein an adding process by the adder enhances an output voltage and a signal-to-noise ratio.

The magnetic sensor of the present invention is preferably structured such that (1) an outline formed of the cross-shaped magnetometric sensing surface and the power terminal portions and the output terminal portions is quadrature-symmetrical with the center, that (2) the slits completely split the power terminal portions and the output terminal portions and in partway split the each extension at the cross-shaped magnetometric sensing surface, respectively at regular intervals, that (3) a ratio of a length of a border to a distance between two midpoints is no less than ⅓ and no greater than 3, the border bounding the slit and the extension at the magnetometric sensing surface, one of the midpoints being a midway point between mutually opposed extensions split by the slits at the magnetometric sensing surface with the rectangular portion located between the extensions, and the other of the midpoints being a midway point between mutually opposed extensions split by the slits at the magnetometric sensing surface with the rectangular portion located between the extensions, and that (4) further comprises shunts connected to the power terminal portions of the Hall device, an absolute circuitry connected to the adder, and a bias adjuster connected to the absolute circuitry, wherein the shunts and the absolute circuitry and the bias adjuster supply potential differences to the power terminal portions, from which the Hall device generates a maximum Hall voltage.

BEST MODE FOR CARRYING OUT THE INVENTION

Embodiments of the present invention are described below in conjunction with the drawings.

Embodiment 1

Power source terminals and Hall voltage output terminals are formed of a low-resistance material, and thus their terminal surfaces become equipotential. This is one of the reasons for the effect of the power terminals and the Hall voltage output terminals on a Hall voltage. Therefore, a distance between these terminals of a Hall device of the present invention is enlarged, and alternately slits are provided with the terminals, each of the slits including an insulator or a layer having electrical effect similar to that of an insulator in order to reduce the effect of the terminals on a potential distribution in a magnetometric sensing surface.

Figure 9:
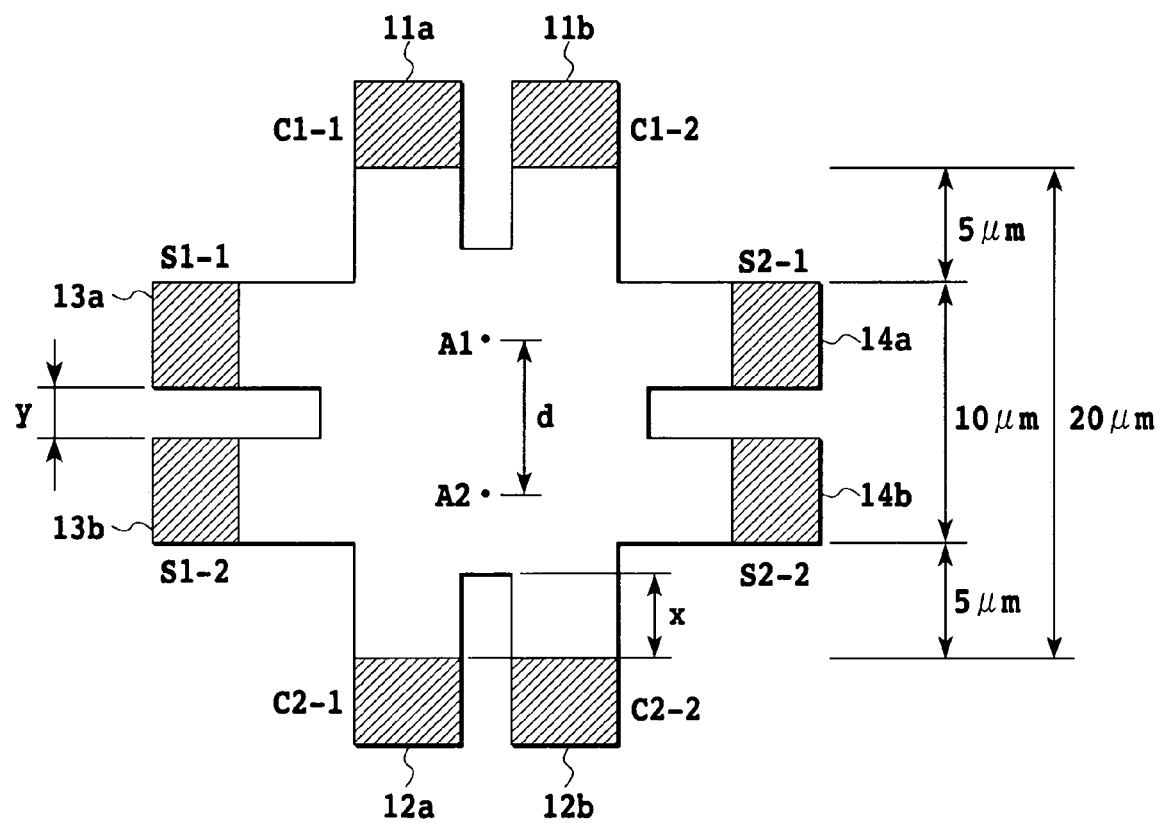
FIG. 9 schematically illustrates a structure of a cross-shaped Hall device each of the terminals of which is split into two parts according to the present invention.

FIG. 9 schematically illustrates a structure of a symmetry-type Hall device as an example of the present invention. The entire configuration of a magnetometric sensing surface of the Hall device is substantially cross-shaped. Each side of the rectangular portion is 10 μm in length, and is provided with an extension having a short side of 5 μm in length.

One slit having a cut depth of x and a width of y is formed in each of the four extensions at the magnetometric sensing surface, thereby splitting each extension into equal halves. Further, each of the slits is provided with an insulator or a layer having electrical effect similar to that of an insulator.

The extensions split into equal halves in this manner are provided with power terminals $C_{1-1}11a$, $C_{1-2}11b$ and power terminals $C_{2-1}12a$, $C_{2-2}12b$, and with Hall voltage output terminals $S_{1-1}13a$, $S_{1-2}13b$ and Hall voltage output terminals $S_{2-1}14a$, $S_{2-2}14b$, respectively mutually opposed.

In the case of a conventional Hall device whose terminals are not split with slits, the potential at the center of the cross-shaped magnetometric sensing surface becomes the reference voltage for the Hall voltage output terminals. However, according to the Hall device shown in FIG. 9, the reference voltage of the pair of the Hall voltage output terminals $S_{1-1}13a$ and $S_{2-1}14a$ corresponds to the potential at a midpoint $A_1$ between these terminals. Similarly, the reference voltage of the pair of the Hall voltage output terminals $S_{1-2}13b$ and $S_{2-2}14b$ corresponds to the potential at a midpoint $A_2$ between these terminals. As a result, the effect of the present terminals on the potential distribution can be reduced.

When the cut depth x of the slits in the Hall device shown in FIG. 9 is too long, the flow of the carriers is adversely affected to decrease the Hall voltage. It is thus desirable to establish a narrower slit width y and a shorter cut depth x. It is also desirable to provide a resistance between the split terminals, which resistance is equal to the resistance between $A_1$ and $A_2$, in order to provide sufficient difference between the reference voltages of the split terminals.

With respect to the split configuration, it is desirable to establish the cut depth x and the slit width y such that the current path between the split two halves is substantially equal in length to the distance between the midpoints between the terminals. Thus, the slit of the Hall device of the present invention as shown in FIG. 9 is formed on conditions that the periphery length (2x+y) of the slit becomes greater than the distance (d) between $A_1$ and $A_2$.

Additionally, the Hall device shown in FIG. 9 has one slit in each of the terminals split into equal halves, but more slits at regular intervals may be defined in each of the terminals to equally split each terminal into equal to or more than two terminals.

Figure 10:
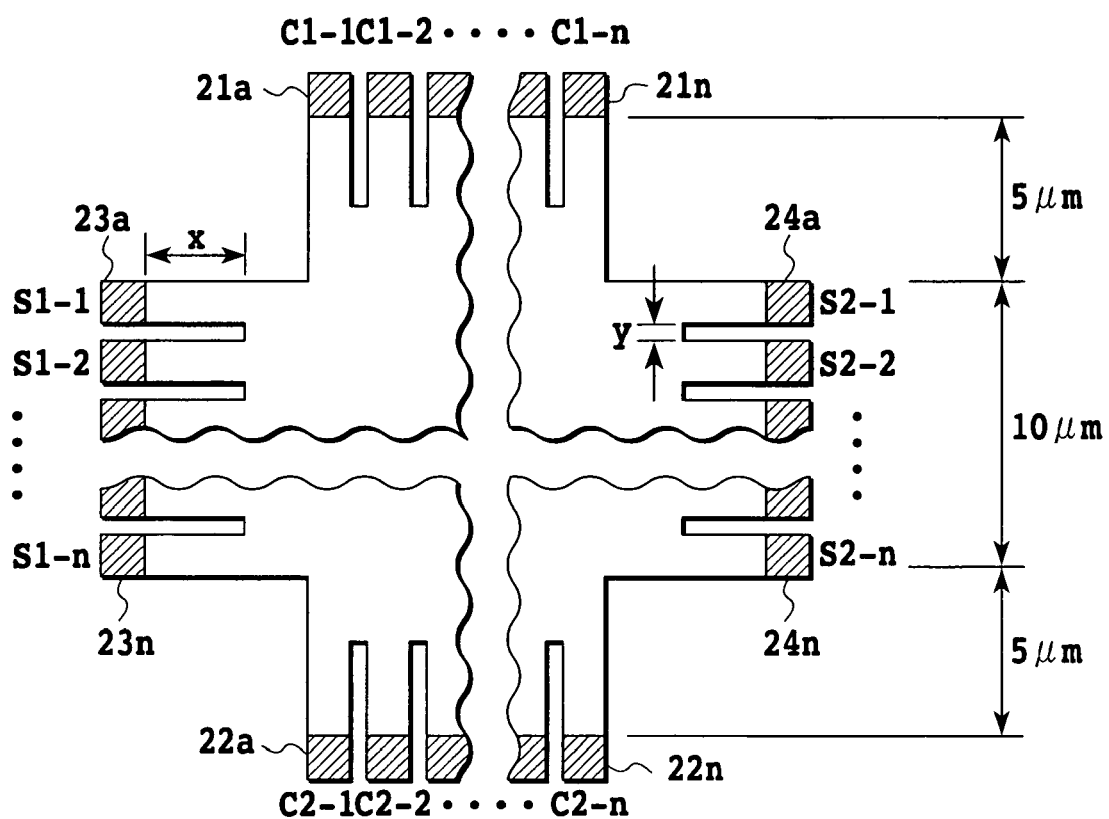
FIG. 10 schematically illustrates a structure of a cross-shaped Hall device each of the terminals of which is split into n parts according to the present invention.

FIG. 10 illustrates another example structure of a Hall device according to the present invention. Each of extensions at a magnetometric sensing surface is provided with (n−1) slits, and the extensions at the surface and the terminals attached thereto are split into n equal parts. The entire configuration of the Hall device is substantially cross-shaped. Each side of the rectangular portion is 10 μm in length, and is provided with an extension having a short side of 5 μm in length. As many as (n−1) slits having a cut depth of x and a width of y are formed in each of the extensions at the magnetometric sensing surface, thereby splitting each extension into n equal parts. Each of the slits is provided with an insulator or a layer having electrical effect similar to that of an insulator.

The extensions split into n equal parts are provided with power terminals $C_{1-1}21a$ through $C_{1-n}21n$ and power terminals $C_{2-1}22a$ through $C_{2-n}22n$, and with Hall voltage output terminals $S_{2-1}23a$ through $S_{2-n}23n$ and Hall voltage output terminals $S_{2-1}24a$ through $S_{2-n}24n$, respectively mutually opposed.

According to the Hall devices formed slits in the extensions at the magnetometric sensing surface and the terminals as illustrated in FIGS. 9 and 10, the terminals are split into a plurality of equal parts by the insulator layers. Thus, as described above, the reference voltages of each pair of Hall voltage output terminals become equivalent to the potential at adjacent regions of the magnetometric sensing surface to these terminals. As a result, the effect of the terminals on the potential distribution in the magnetometric sensing surface can be reduced.

[Comparison 1]

Each extension at a magnetometric sensing surface and each terminal attached to the extensions are split into equal halves by a slit in a cross-shaped Hall device of the present invention. A Hall voltage, a potential distribution and a velocity distribution of electrons moving in the Hall device are obtained from a simulation in order to investigate the effect of splitting the terminals.

Figure 11:
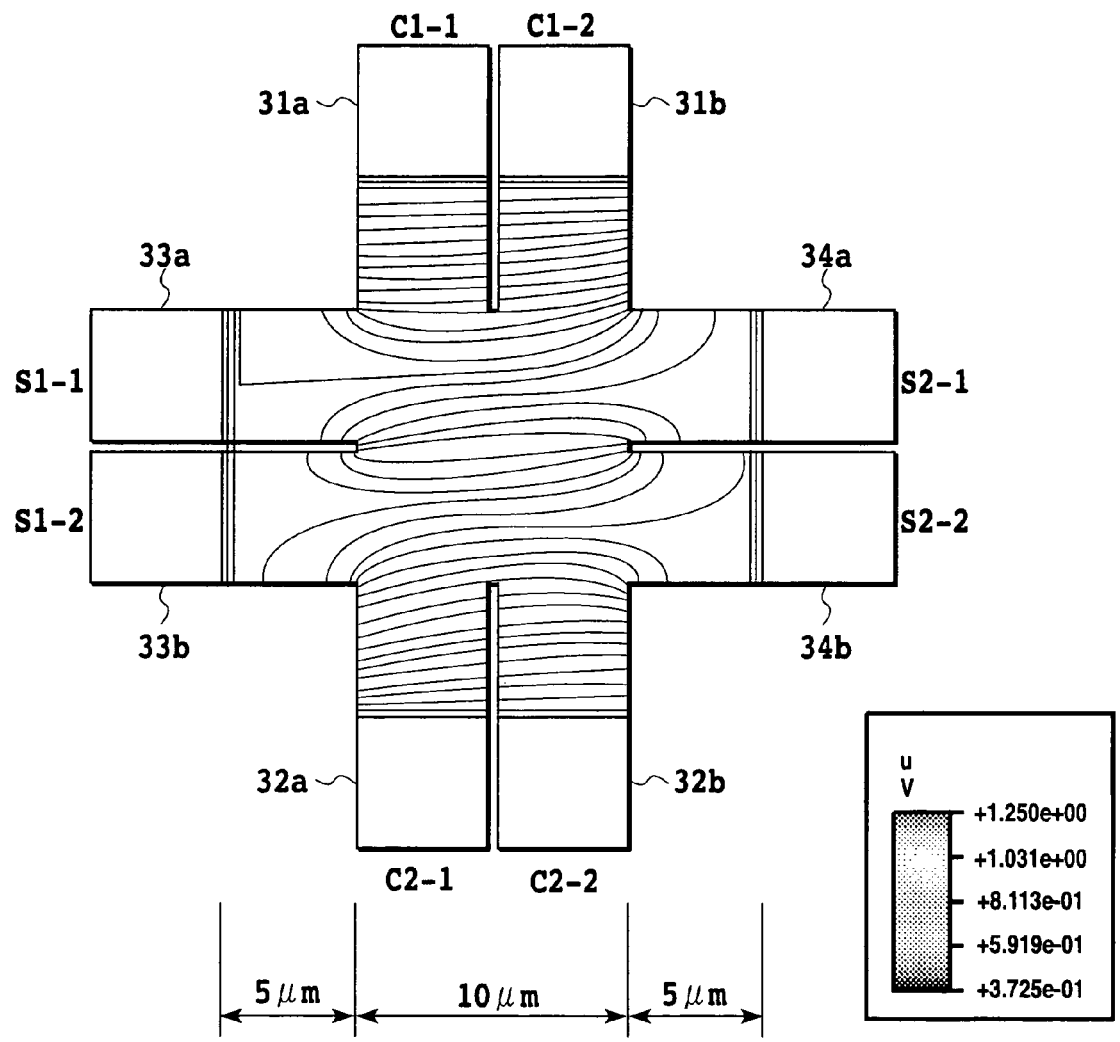
FIG. 11 shows a potential distribution in a magnetometric sensing surface of a cross-shaped Hall device each of the terminals of which is split into two parts according to the present invention.

FIG. 11 shows the structure of the Hall device having slits according to the present invention which is used in this simulation, and also illustrates a potential distribution obtained from the simulation. The entire configuration of a magnetometric sensing surface of the Hall device is substantially cross-shaped. Each side of the rectangular portion is 10 μm in length, and is provided with an extension having a short side of 5 μm in length. A slit having a cut depth of x and a slit width of y is formed in each of the four extensions. Each of the four extensions are provided with one slit having a cut depth of x and a width of y, and each of the slits is provided with an insulator or a layer having electrical effect similar to that of an insulator, thereby splitting each extension into equal halves.

The extensions split into equal halves in this manner are provided with power terminals $C_{1-1}31a$, $C_{1-2}31b$ and power terminals $C_{2-1}32a$, $C_{2-2}32b$, and with Hall voltage output terminals $S_{1-1}33a$, $S_{1-2}33b$ and Hall voltage output terminals $S_{2-1}34a$, $S_{2-2}34b$, respectively mutually opposed.

The potential distribution and the Hall voltages produced between the Hall voltage output terminals $S_{1-1}33a$, $S_{1-2}33b$ and the Hall voltage output terminals $S_{2-1}34a$, $S_{2-2}34b$ are obtained from the simulation on condition that principal current of 0.1 mA in total flows between the power terminals $C_{1-1}31a$, $C_{1-2}31b$ and the power terminals $C_{2-1}32a$, $C_{2-2}32b$ and a magnetic flux density of 1T perpendicular to the principal current is applied.

Figure 12:
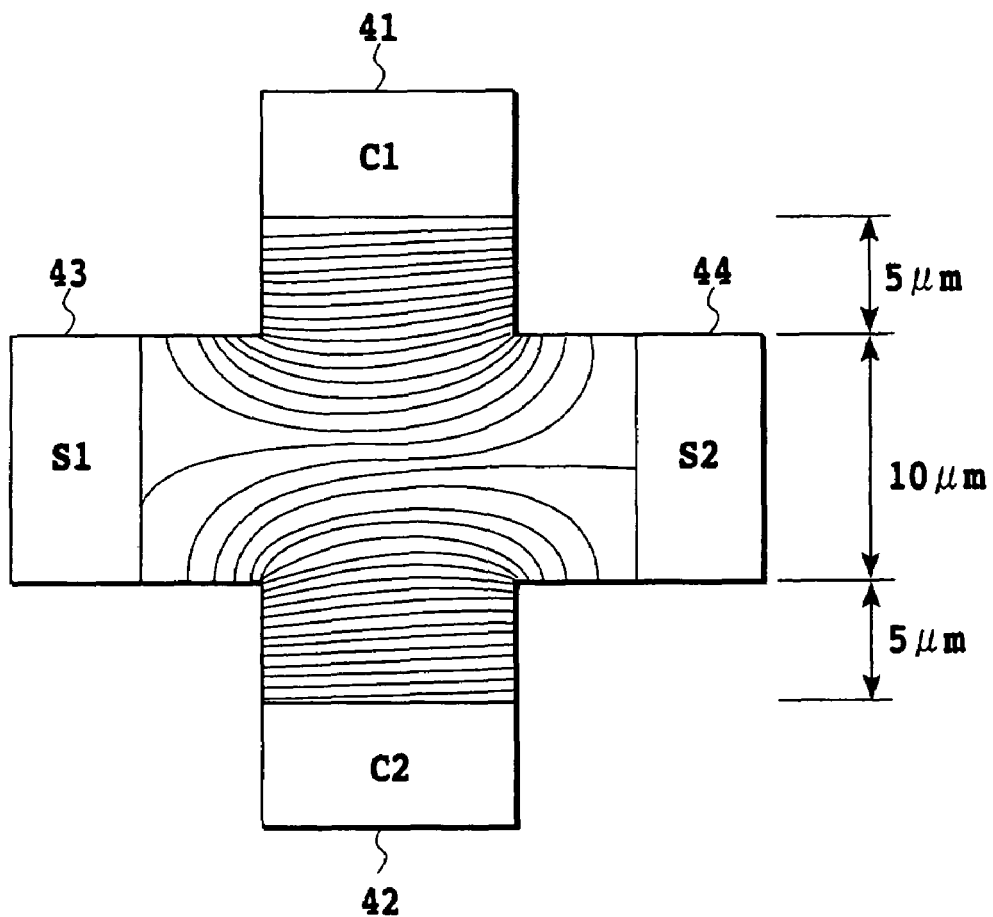
FIG. 12 shows a potential distribution in a magnetometric sensing surface of a conventional cross-shaped Hall device.

FIG. 12 schematically illustrates a Hall device having no slit prepared for a simulation for comparison and shows a potential distribution obtained from the simulation. The entire configuration of a magnetometric sensing surface of the Hall device is cross-shaped. Each side of the rectangular portion is 10 µm in length, and is provided with an extension having a short side of 5 µm in length.

The four extensions are equipped with a power terminal $C_1$ 41 and a power terminal $C_2$ 42, and with a Hall voltage output terminal $S_1$ 43 and a Hall voltage output terminal $S_2$ 44, respectively mutually opposed. The potential distribution and the Hall voltage produced between the Hall voltage output terminal $S_1$ 43 and the Hall voltage output terminal $S_2$ 44 are obtained from the simulation on condition that principal current of 0.1 mA in total flows between the power terminal $C_1$ 41 and the power terminal $C_2$ 42 and a magnetic flux density of 1T perpendicular to the principal current is applied.

It is found that the Hall voltage obtained with the Hall device shown in FIG. 11 while assuming a slit with a cut depth x of 5 µm and a width y of 0.2 µm is approximately 8% higher than the Hall voltage obtained by assuming the Hall device shown in FIG. 12. Therefore, it is confirmed that forming slits in the extensions at the magnetometric sensing surface and the terminals increases the Hall voltage.

Figure 13:
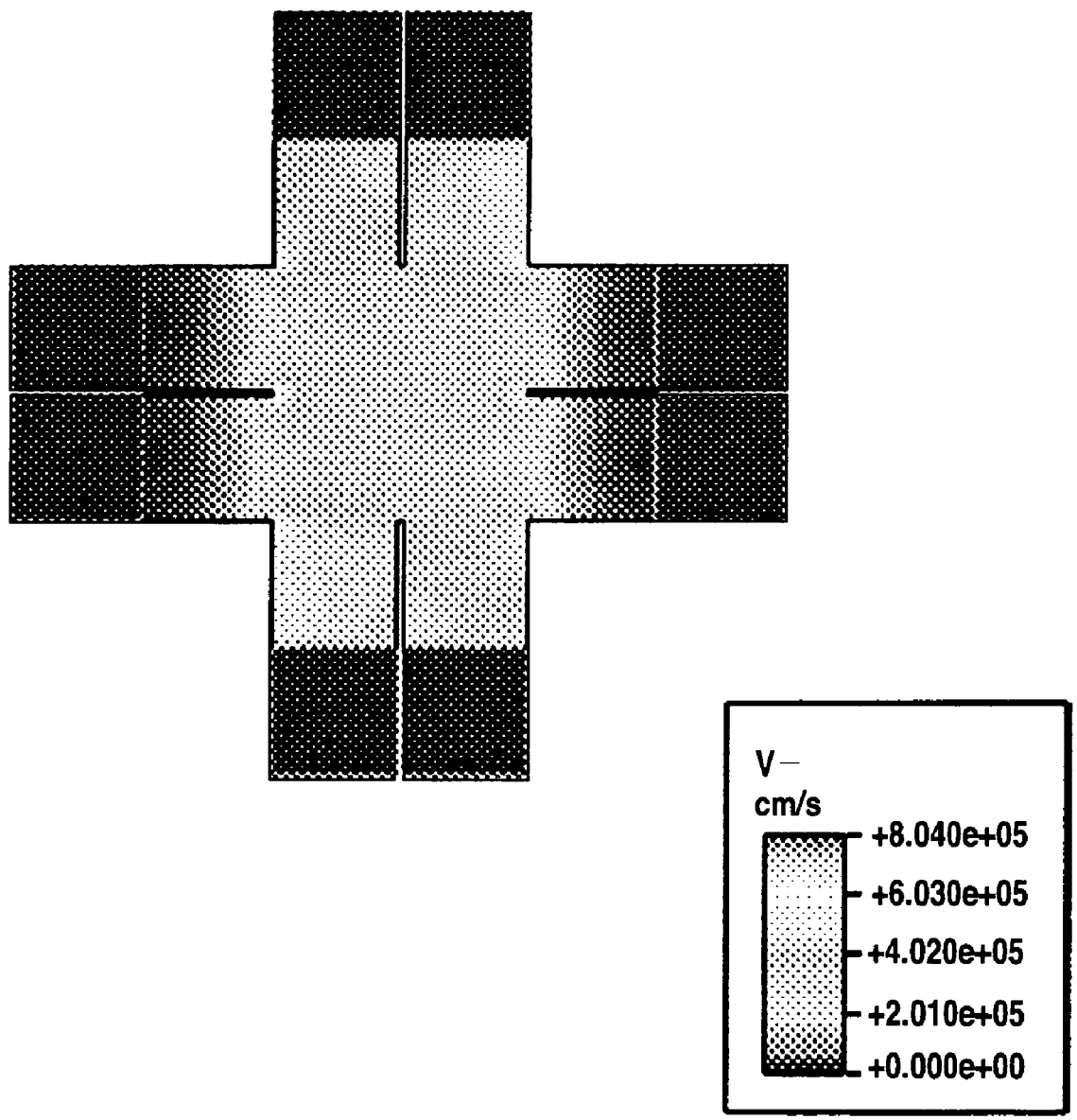
FIG. 13 shows an electron velocity distribution in a magnetometric sensing surface of a cross-shaped Hall device each of the terminals of which is split into two parts according to the present invention.

FIG. 13 shows a carrier (electron) velocity distribution as a result of a simulation with respect to the Hall device shown in FIG. 11 whose slits have a slit cut depth x of 5 µm and a width y of 0.2 µm.

Figure 14:
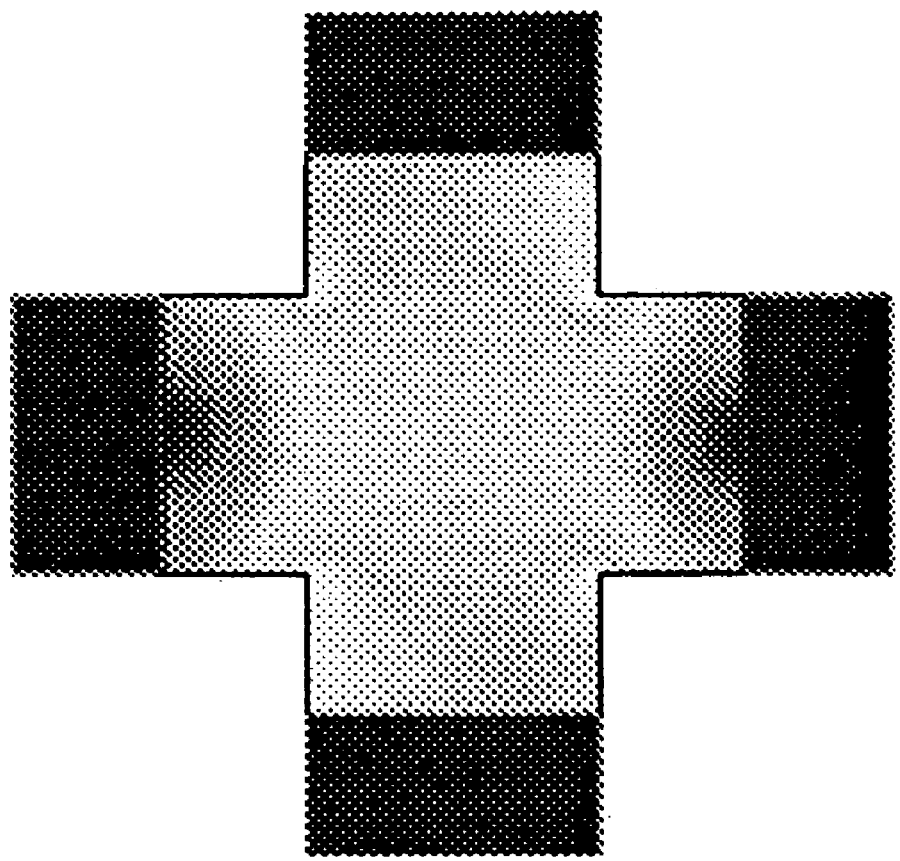
FIG. 14 shows an electron velocity distribution in a magnetometric sensing surface of a conventional cross-shaped Hall device.

FIG. 14 shows a carrier (electron) velocity distribution as a result of a simulation with respect to the Hall device shown in FIG. 12.

As can be seen from the comparison between both of the results illustrated in FIGS. 13 and 14, the electron velocity about the center of the magnetometric sensing surface of the Hall device having no splits in the terminals is lowered, whereas substantially no decrease in the electron velocity is found in the magnetometric sensing surface of the Hall device having splits in the terminals.

[Comparison 2]

Figure 15:
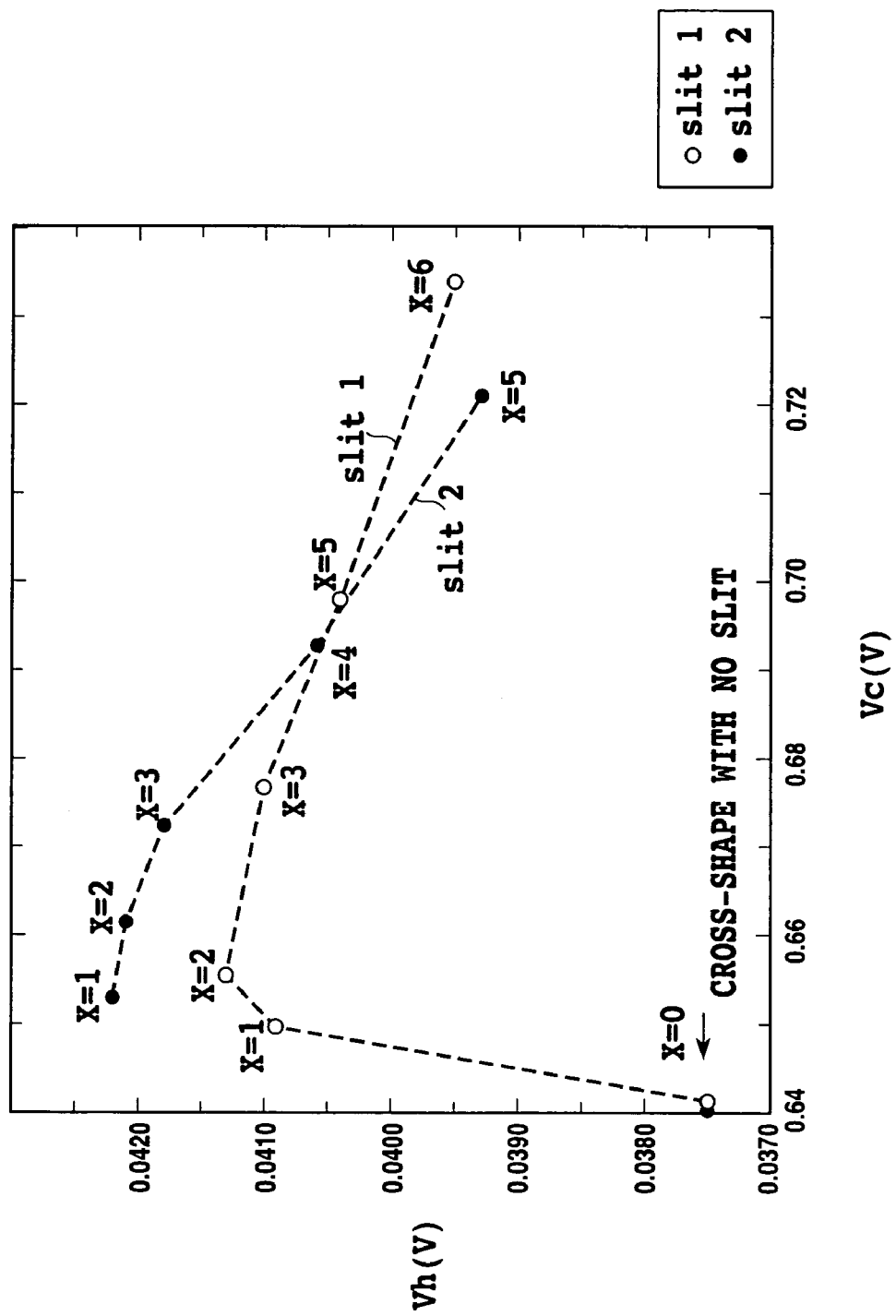
FIG. 15 shows the relationship between a Hall voltage and a voltage between power terminals in a cross-shaped Hall device each of the terminals of which has one or two slits according to the present invention as a result of a simulation.

FIG. 15 shows the relationship between a Hall voltage and a voltage across power terminals in a Hall device having a slit or slits in each extension at a magnetometric sensing surface and each terminal according to the present invention as a result of a simulation. The vertical axis indicates the values of Hall voltage and the horizontal axis indicates the values of voltage between the power terminals. The simulation was done on condition that one slit or two slits of the constant width y of 0.2 µm are provided (splitting into two or three parts), while varying the cut depth x from 0 through 5 µm at each 1 µm.

The entire configuration of a magnetometric sensing surface of the Hall device is substantially cross-shaped. Each side of the rectangular portion is 10 µm in length, and is provided with an extension having a short side of 5 µm in length. These extensions are provided with the terminals.

When the slit cut depth x is 2 µm with respect to the Hall device having one slit to split into two parts, the Hall voltage is about 10% higher than that of the Hall device having no slit (i.e. x=0 µm), and substantially no difference is found in the voltage across power terminals compared with the Hall device having no slit. When the slit cut depth x is narrowed to 1 µm, the resistance between the terminals is lowered to cut-down the increase in the Hall voltage to approximately 9%.

With respect to the Hall device having two slits to split into three parts, the Hall voltage is about 5% higher when the slit cut depth x is 5 µm. The Hall voltage is about 12% higher and substantially no difference is found in the voltage across power terminals compared with the Hall device having no slit when the slit cut depth x is 1 µm.

From these results, it is realized that the following configuration in the Hall device causes the Hall voltage enhanced. That is, the extensions(and the terminals connected thereto) at the magnetometric sensing surface of the Hall device are split by a slit or slits into equal parts and a ratio of a length (2x+y) of a border to a distance between two midpoints is no less than ⅓ and no greater than 3, the border bounding the slit and the extension at the magnetometric sensing surface, one of the midpoints being a midpoint between mutually opposed extensions split by the slits at the magnetometric sensing surface with the rectangular portion located between the extensions, and the other of the midpoints being a midpoint between mutually opposed extensions split by the slits at the magnetometric sensing surface with the rectangular portion located between the extensions. The results indicates that the Hall voltage is increased to the maximum value and a lowered voltage across the power terminals is obtained when the configuration of the slit is selected such that the ratio is 1.

In this comparison, a cross-shaped Hall device is employed as an example. However, it is expected that similar results are obtained if a Hall device having another shape is used.

Embodiment 2

Figure 16:
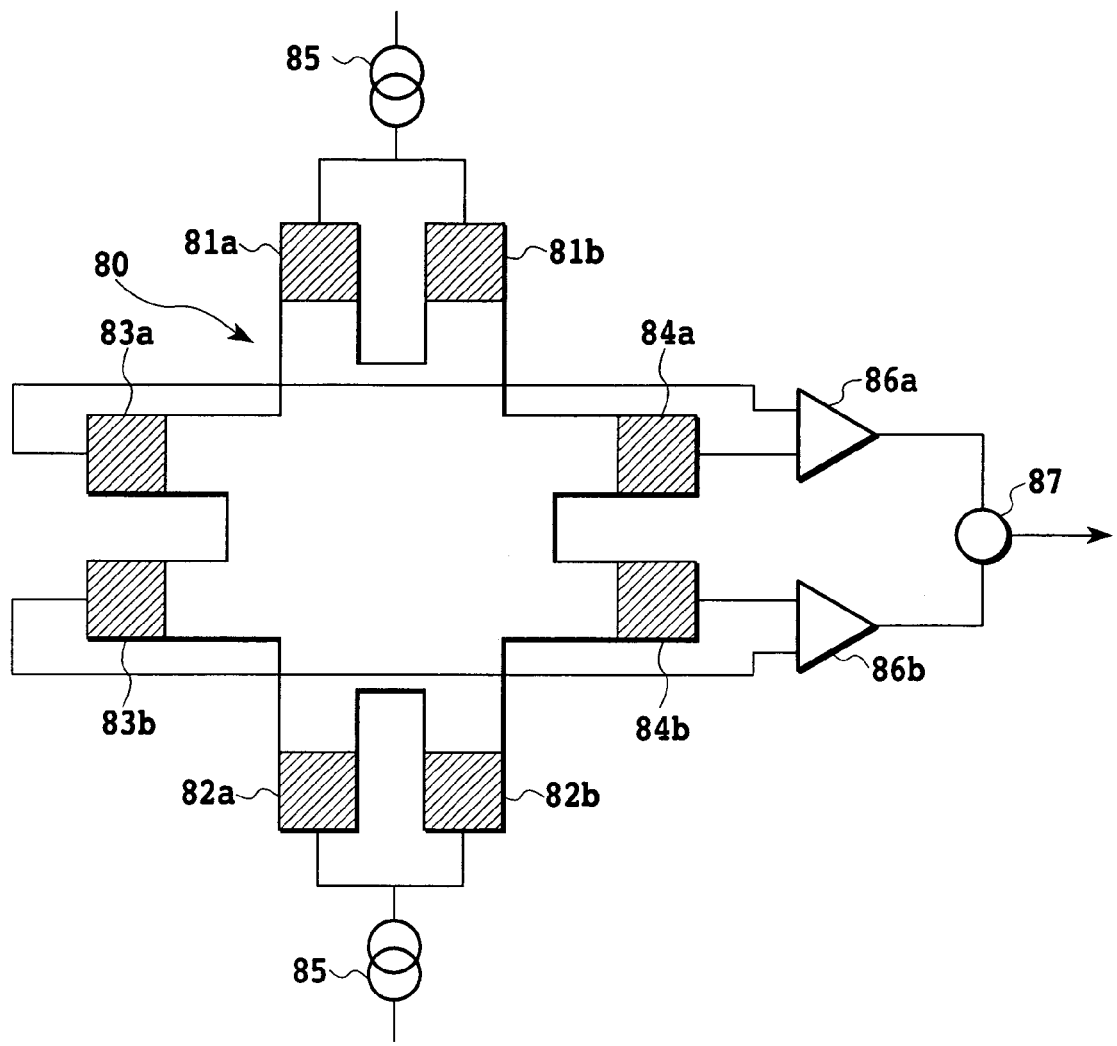
FIG. 16 is a circuit diagram of a magnetic sensor according to the present invention in which an adder is fitted to a Hall device of the invention.

FIG. 16 schematically illustrates a structure of a magnetic sensor including a Hall device of the present invention and an adder connected thereto. Extensions and terminals of a Hall device 80 are split by a slit into equal halves respectively. A current source 85 is connected respectively to power terminals 81*a*, 81*b*, 82*a* and 82*b* of the Hall device 80. Hall voltages produced by the Hall device 80 are outputted through differential amplifiers 86*a* and 86*b* connected to Hall voltage output terminals 83*a*, 83*b*, 84*a* and 84*b*. The output voltages are added by an adder 87.

The Hall voltage produced by the pair of the Hall voltage output terminals connected to the differential amplifier circuit is almost equal to an output voltage from a differential amplifier in the configuration without splitting the terminals. Accordingly, it is possible to supply the output voltages from the differential amplifiers 86*a* and 86*b* to the adder 87 to perform adding process.

In this embodiment, each extension at the magnetometric sensing surface of the Hall device and each terminal are split into two parts. However, the splitting number is not limited to two and any other splitting number n (n=2 or higher natural number) may be selected.

Thus, approximately n times higher Hall voltage and an approximately $\sqrt{n}$ times higher signal-to-noise ratio can be obtained employing with a single Hall device.

Additionally, an offset compensation with a conventional SCM can be attained by connecting the power terminals and the Hall voltage output terminals to a switching circuit to exchange their functions alternately.

Furthermore, the drive voltage required for a constant-current Hall device can be reduced due to a short distance between the terminals, which makes a power source circuit simple and small-sized.

Embodiment 3

According to the above-described magnetic sensor of the present invention, the effect of the Hall voltage output terminals on the potential distribution in the magnetometric sensing surface can be reduced. However, it is difficult to completely remove the effect of the power terminals on the potential distribution as long as an equal voltage is applied to each of the split power terminals. For solving this problem, shunts, a bias adjuster and an absolute value circuit are appended to the magnetic sensor circuit shown in FIG. 16.

Figure 17:
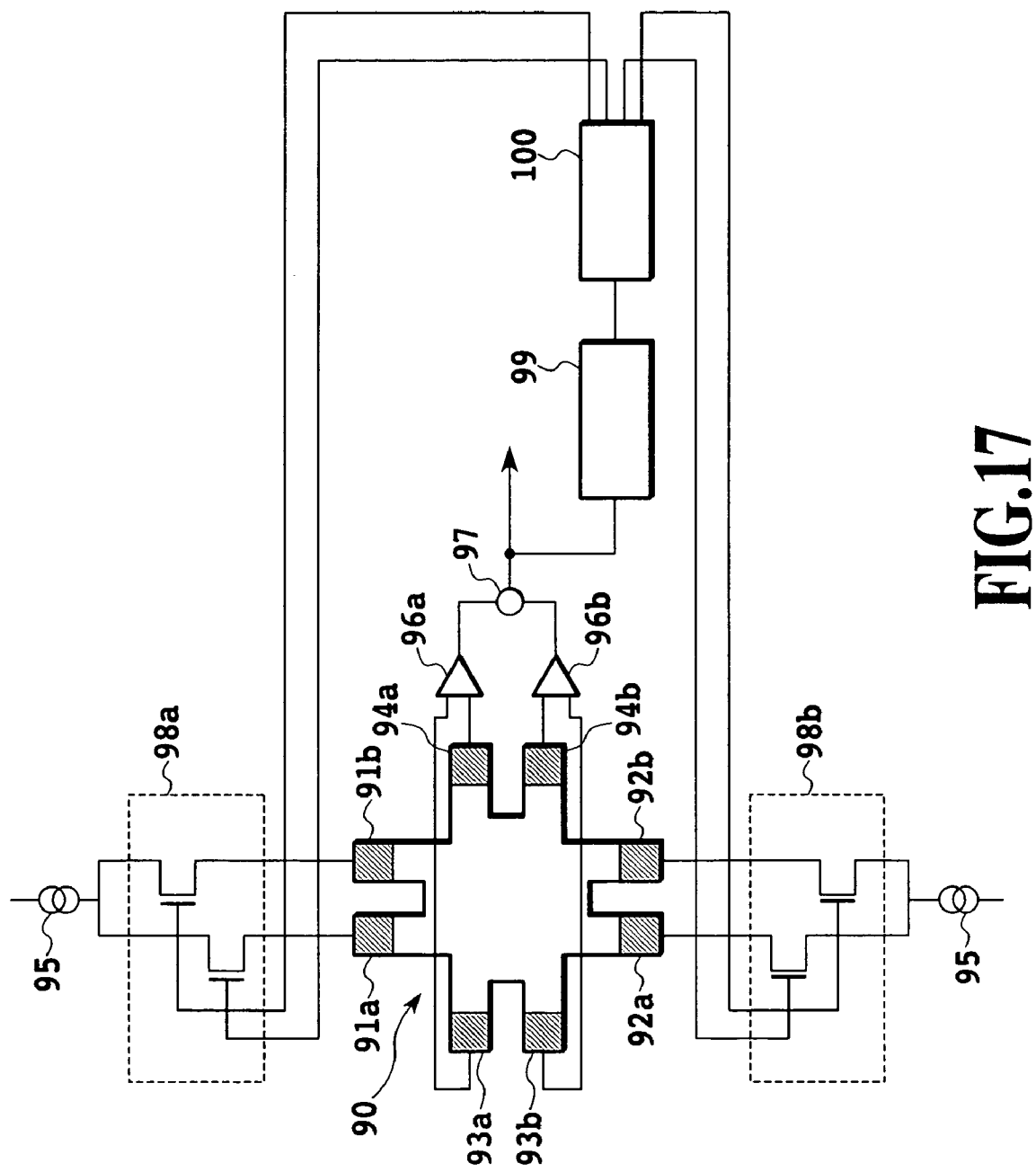
FIG. 17 is a circuit diagram of a magnetic sensor according to the present invention in which an absolute value circuit and a bias adjuster are fitted to the magnetic sensor of the invention as shown in FIG. 16.

FIG. 17 schematically illustrates the magnetic sensor comprising the Hall device of the present invention to which the adder, the shunts, the bias adjuster and the absolute value circuit are appended. Current sources 95 are respectively connected through shunts 98a and 98b to power terminals 91a, 91b, 92a and 92b of a magnetometric sensing surface of a Hall device 90 in which each of extensions at magnetometric sensing surface and terminals is split into equal halves. Hall voltages produced by the Hall device 90 are outputted through differential amplifiers 96a and 96b connected to Hall voltage output terminals 93a, 93b, 94a and 94b. An adder 97 is equipped to add the outputted Hall voltages. An absolute value circuit 99 is connected to the adder 97, and a bias adjuster 100 is connected to the absolute value circuit 99 in turn.

According to the circuit of the above structure, the Hall voltage differences between the Hall voltages produced at the pairs of the Hall voltage output terminals 93a, 94a and 93b, 94b are outputted through the differential amplifiers 94a and 94b, respectively. Then, the Hall voltage obtained by adding the outputted Hall voltages at the adder 97 is applied to the absolute value circuit 99. An output voltage from the absolute value circuit 99 is applied to the bias adjuster 100. Control signals outputted from the bias adjuster 100 are then applied to the shunts 98a and 98b.

The shunts 98a, 98b adjust the voltage differences given across the power terminals 91a, 91b and 92a, 92b of the Hall device, respectively, in accordance with the control signals from the bias adjuster 100. Thus, the shunts 98a and 98b, the absolute value circuit 99 and the bias adjuster 100 are used to provide potential differences between the split power terminals 91a and 91b and between the split power terminals 92a and 92b to adjust the voltage differences such that the absolute value of the Hall voltage is maximized. This allows a further improvement in the sensitivity of the magnetic sensor.

Embodiment 4

The Hall device and the magnetic sensor including the Hall device according to the present invention usually do not depend on quality of the materials used for forming the device, and can be manufactured from various materials such as GaAs, Si, InAs and InSb. When the Hall device and its peripheral circuits are formed on a Si substrate, Si process allowing fine pattering can be adopted. Thus, a miniaturized and high performance Si Hall device is provided.

Described below is a method for manufacturing a Hall device according to the present invention.

The Hall device of the present invention can be easily manufactured by altering mask patterns for forming terminals of the Hall device and semiconductor layers connected to the terminals.

Figure 18:
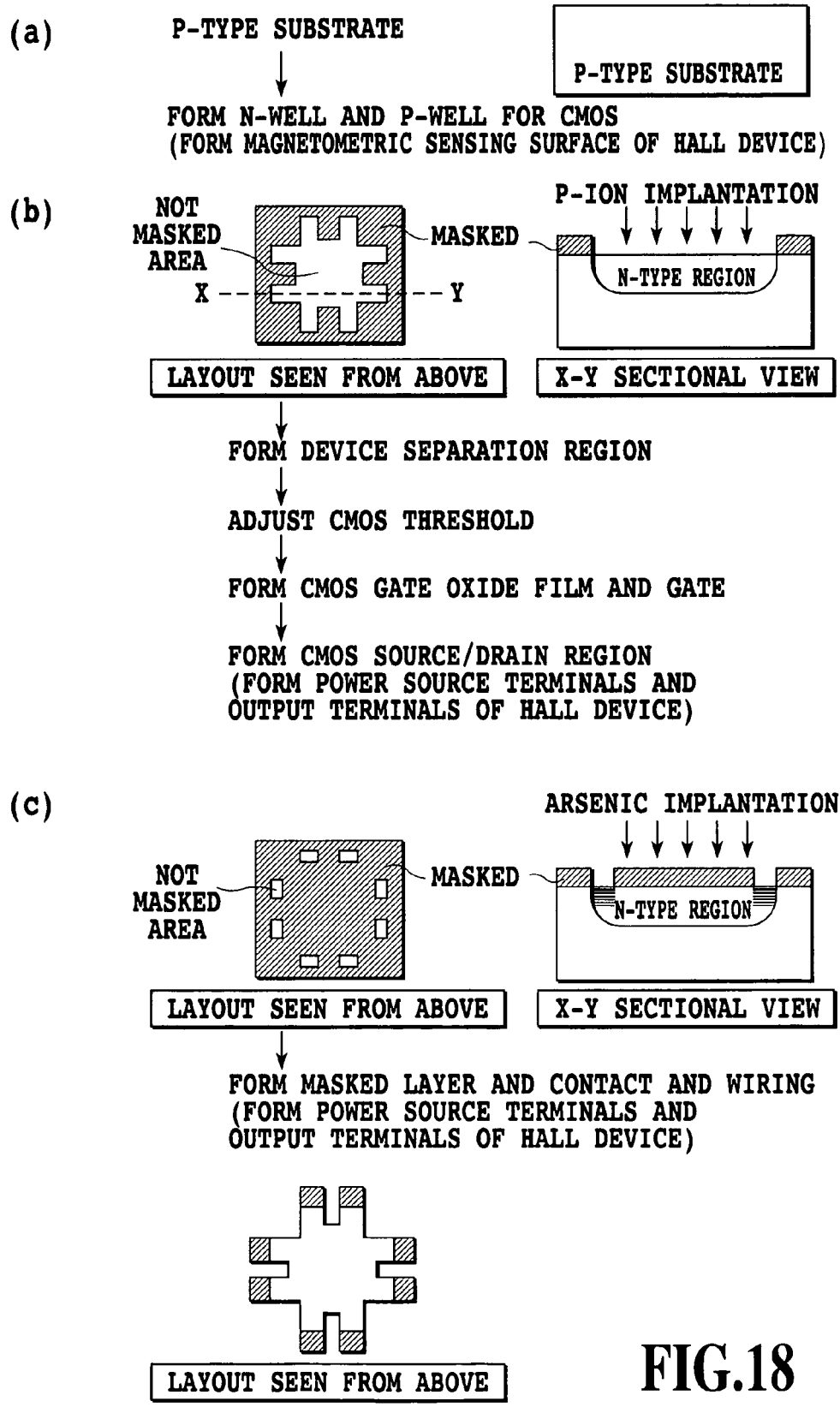
FIG. 18 shows processes for manufacturing a Hall device according to the present invention.

FIG. 18 shows an example process for manufacturing a Hall device of the present invention which is formed adjacently to a CMOS device.

An N well and a P well for the CMOS device are made on a p-type Si substrate, and a magnetometric sensing surface of the Hall device is made in a region adjacent to these wells (FIG. 18(a)). A cut depth x and a slit width y of the magnetometric sensing surface can be easily defined by using a mask matching with those values. A patterning of the magnetometric sensing surface is performed by lithography and etching.

Figure 1:
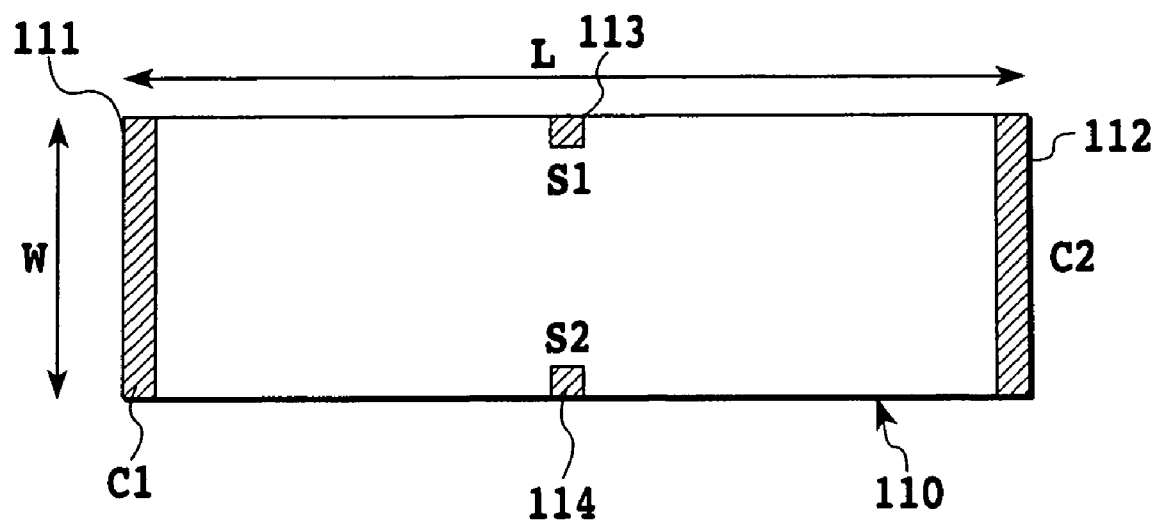
FIG. 1 schematically illustrates a structure of a conventional rectangular Hall device.
Figure 2:
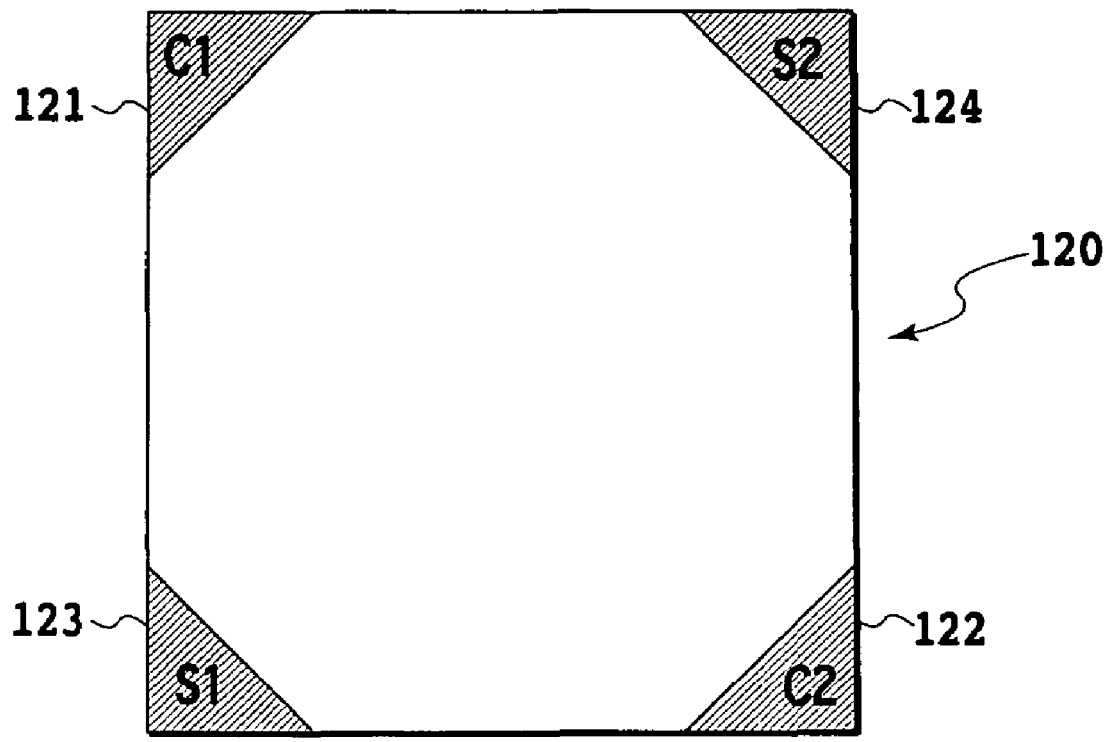
FIG. 2 schematically illustrates a structure of a conventional rectangular Hall device.
Figure 3:
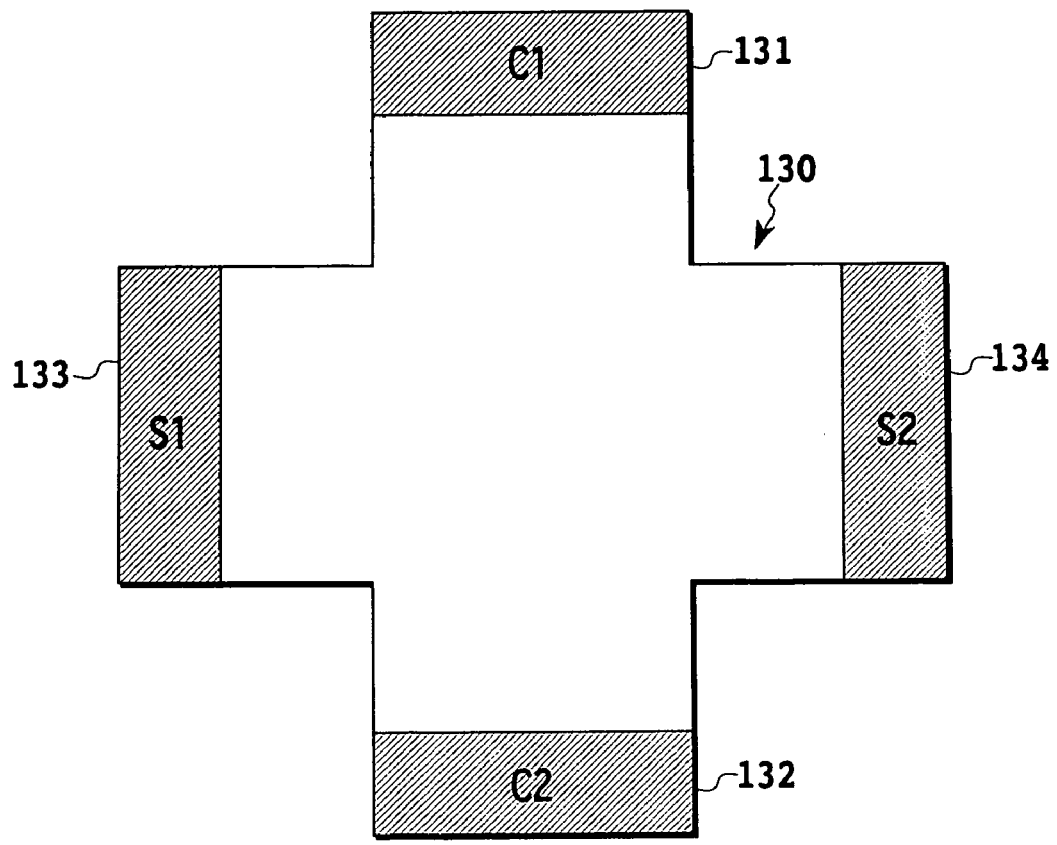
FIG. 3 schematically illustrates a structure of a conventional cross-shaped Hall device.
Figure 4:
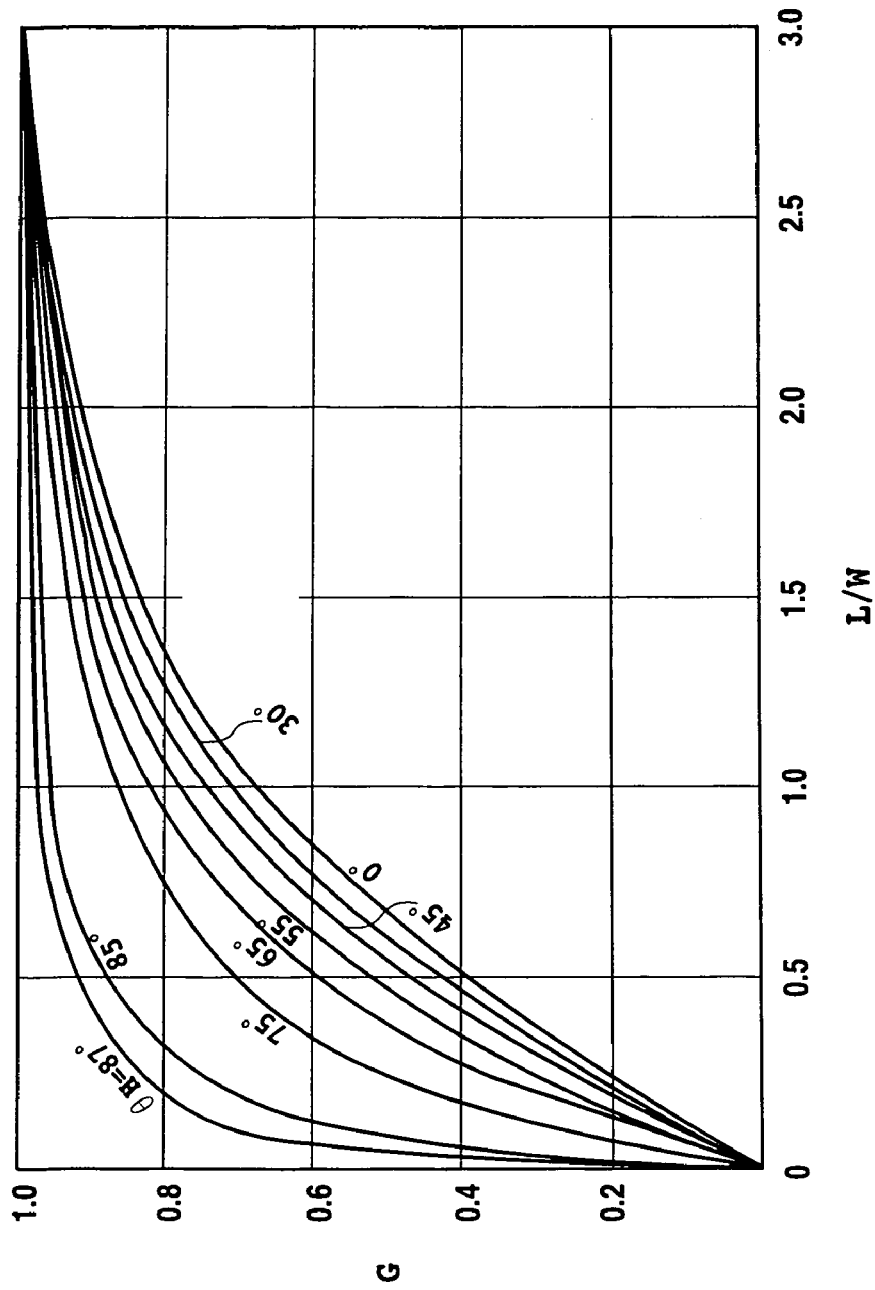
FIG. 4 shows the relationship between the L/W ratio of a conventional rectangular Hall device and a geometrical factor G.
Figure 5:
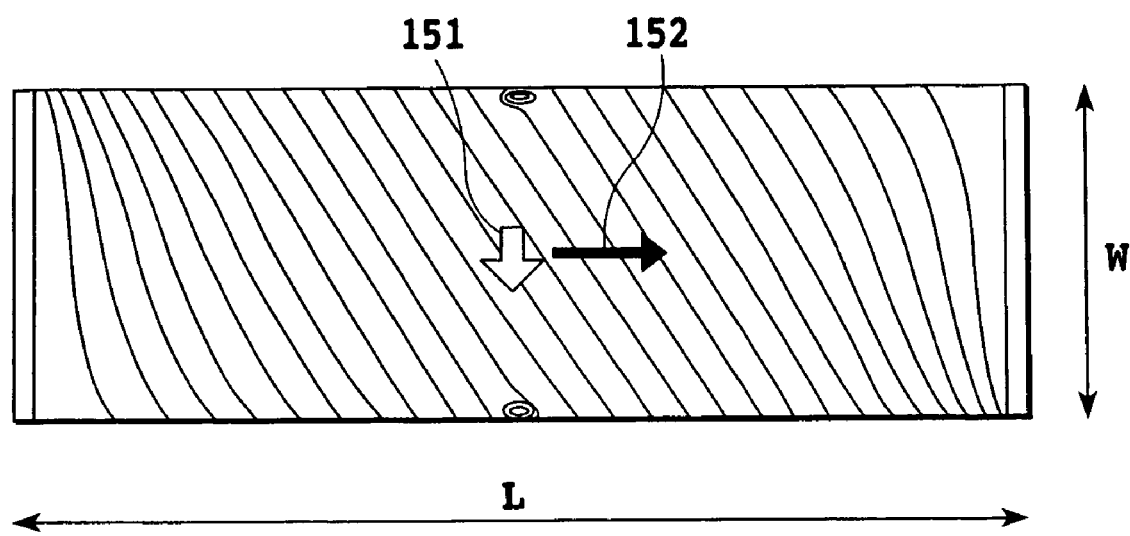
FIG. 5 shows a potential distribution in a magnetometric sensing surface of a conventional Hall device having a rectangular shape of L=3 W as a result of a simulation.
Figure 6:
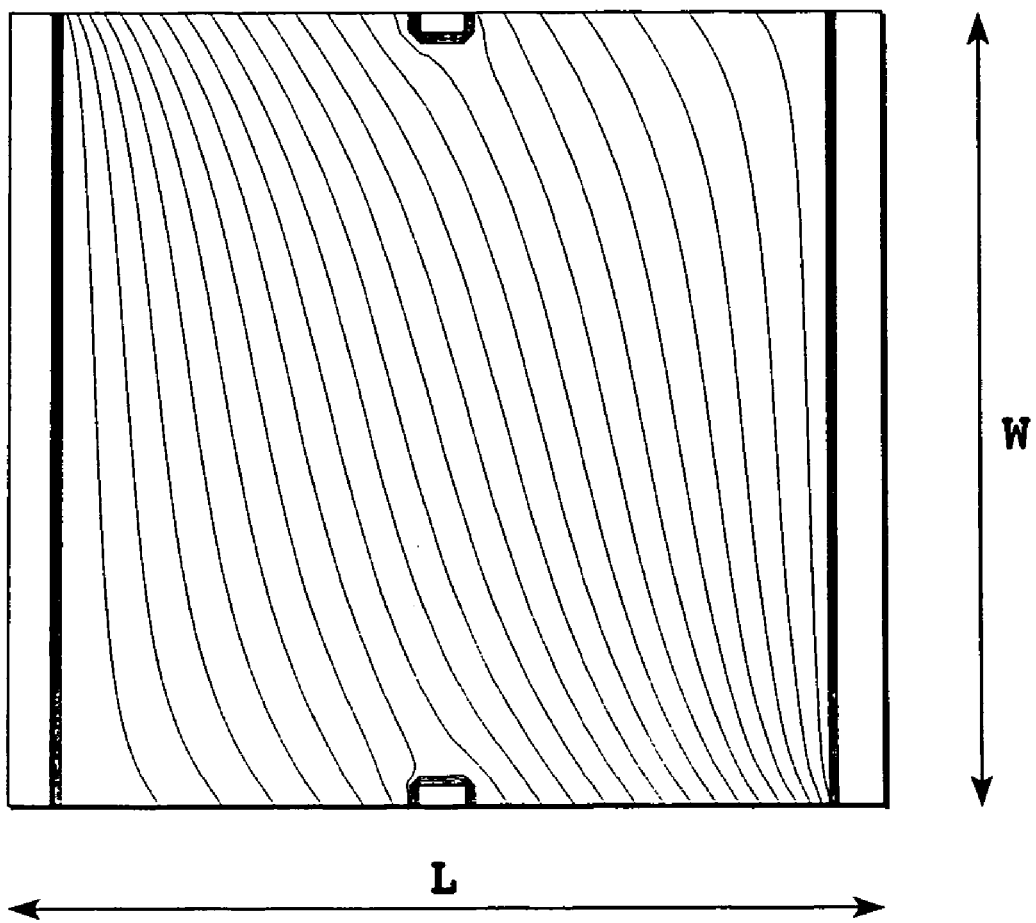
FIG. 6 shows a potential distribution in a magnetometric sensing surface of a conventional Hall device having a rectangular shape of L=W as a result of a simulation.
Figure 7:
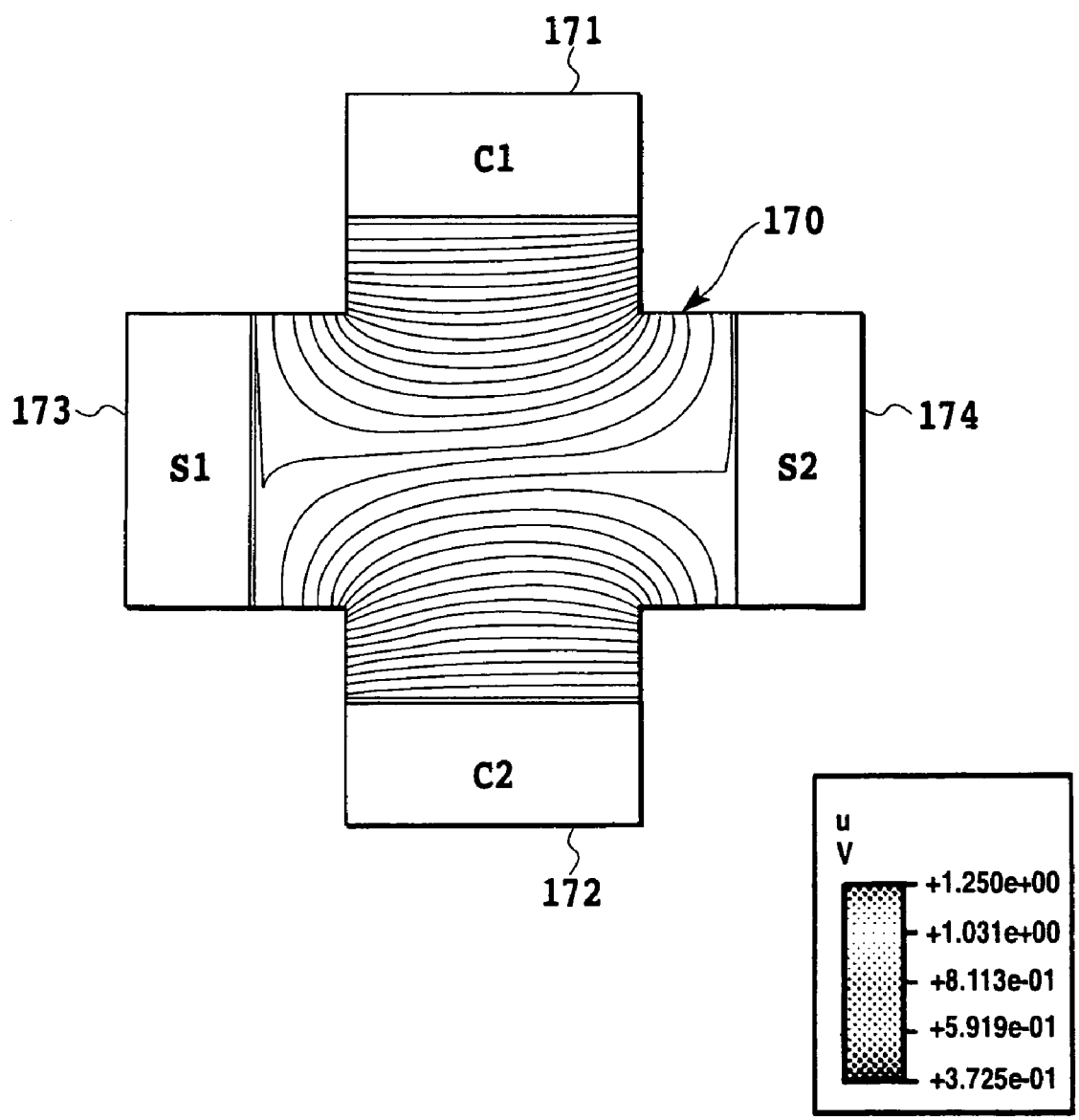
FIG. 7 shows a potential distribution in a magnetometric sensing surface of a conventional cross-shaped Hall device as a result of simulation.
Figure 8:
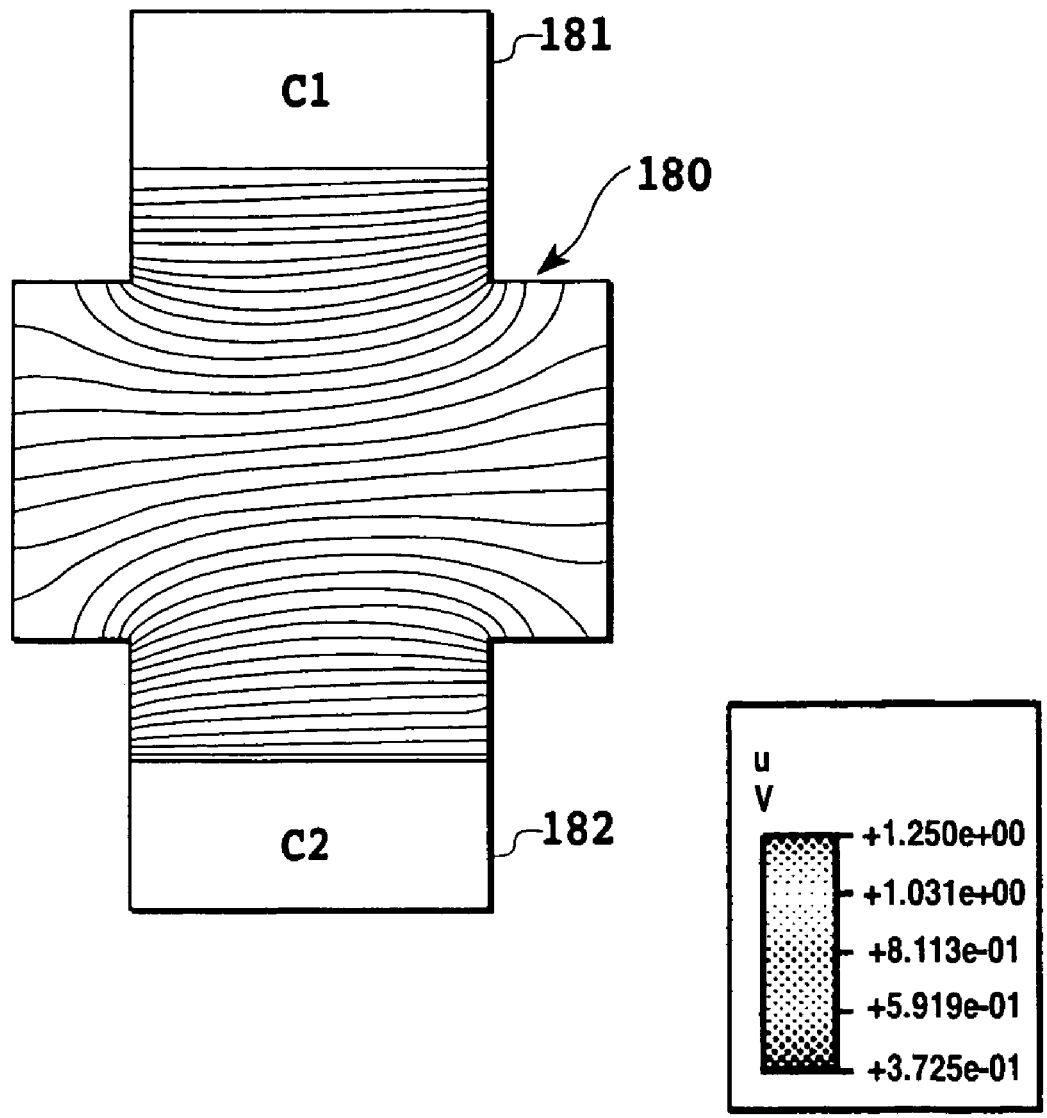
FIG. 8 shows a potential distribution in a magnetometric sensing surface of a conventional cross-shaped Hall device having no Hall voltage output terminal as a result of a simulation.

Subsequently, a part of the substrate is masked and phosphorus (P) is ion-implanted to a region not covered by a mask, thereby forming a device separation region between the magnetometric sensing surface of the Hall device and the substrate (FIG. 8(b)). A patterning of the power terminals and the Hall voltage output terminals is performed by lithography and etching.

After the subsequent threshold adjustment of the CMOS device and formation of gate oxide film, the source/drain region of the CMOS device and the power terminals and the Hall voltage output terminals of the Hall device are formed by ion implantation of arsenic (As) (FIG. 18(c)). The resistance values of the power terminals and the Hall voltage output terminals of the Hall device are adjusted by masking area other than the region at which these terminals are formed and then by implanting a predetermined douse amount of As only through an opening of the mask to control the carrier density.

Additionally, the process condition is established such that the slit width of each terminal is larger than the diffusion length of As diffusing at the post-anneal process after ion implantation of As. This prevents electrical short-circuit between the terminals split by the slit.

Next, an insulating layer is formed in the slit of the terminal. The slit may be electrically insulated by forming film of silicon oxide or polysilicon having high resistance only in the slit, or may be separated through LOCOS or a trench structure.

The CMOS device formed on the p-type substrate and the n-type Si Hall device are thus obtained according to the above method. The above described magnetic sensor of the present invention can be manufactured by connecting the operational amplifier, the adder, the absolute value circuit, the bias adjuster and other circuits to the CMOS region formed through the above process.

According to this embodiment, the Hall device is formed on the Si substrate as an example. However, a substrate applicable to the Hall device is not limited to the Si substrate but may be a substrate made of GaAs, InSb, InAs or other materials.

INDUSTRIAL APPLICABILITY

As aforementioned, according to the present invention, a Hall voltage from each pair of output terminals is increased by equally dividing the extensions at the magnetometric sensing surface and the terminals by the slits.

Further, a Hall voltage equal to the outputs obtained from a plurality of Hall devices is obtained with a single Hall device by connecting an adder for adding outputs from each pair of the output terminals to the Hall device of the present invention.

Therefore, a Hall device has high magnetic field detecting sensitivity and a magnetic sensor capable of providing sufficient offset and obtaining a high Hall voltage with a low drive voltage.

What is claimed is:
1. A Hall device comprising on a substrate:
a cross-shaped magnetometric sensing surface formed of a rectangular portion and four extensions provided one on each side of said rectangular portion, a first pair of said extensions being mutually opposed to each other, a second pair of said extensions being mutually opposed to each other and perpendicular to said first pair of said extensions;

a pair of power terminal portions for inputting a current/voltage provided on said first pair of said extensions;

a pair of output terminal portions for outputting Hall voltage provided on said second pair of said extensions; and slits extending from each of said power terminals and said output terminals, said slits in said power terminals extending in a direction in which said extensions of said first pair oppose one another, said slits in said output terminals extending in a direction in which said extensions of said second pair oppose one another, said slits completely splitting said power terminal portions and said output terminal portions and at least partially splitting each extension, wherein a ratio of a length of a border of a split to a distance between two midpoints is no less than ⅓ and no greater than 3, each extension of said first and second pairs being split into first and second sub extensions by one of said slits, each of said pair of output terminal portions having first and second output terminal sub portions, said first output terminal sub portions being provided on said first sub extensions, said second output terminal sub portions being provided on said second sub extensions, one of said midpoints being a midway point equidistant from said first output terminal sub portions, the other of said midpoints being a midway point equidistant from said second output terminal sub portions, said length of a border of a split being a sum of a death of a slit in one of said extensions multiplied by two and a width of a slit.

2. A Hall device as claimed in claim 1, wherein an outline formed of said cross-shaped magnetometric sensing surface, said power terminal portions and said output terminal portions is symmetrical.

3. A Hall device as claimed in claim 1, wherein said slits completely split said power terminal portions and said output terminal portions, and in partway split said each extension at said cross-shaped magnetometric sensing surface, respectively at regular intervals.

4. A Hall device as claimed in claim 1, wherein said substrate is a semiconductor substrate.

5. A Hall device as claimed in claim 1, wherein each of said slits is provided with a separation layer of an insulator.

6. A Hall device comprising:

a cross-shaped magnetometric sensing surface formed of a rectangular portion and four extensions provided one on each side of said rectangular portion, a first pair of said extensions being mutually opposed to each other, a second pair of said extensions being mutually opposed to each other and perpendicular to said first pair of said extensions;

a pair of power terminal portions for inputting a current/voltage provided on said first pair of said extensions;

a pair of output terminal portions for outputting Hall voltage provided on said second pair of said extensions; and slits extending from each of said power terminals and said output terminals, said slits in said power terminals extending in a direction in which said extensions of said first pair oppose one another, said slits in said output terminals extending in a direction in which said extensions of said second pair oppose one another, said slits completely splitting said power terminal portions and said output terminal portions and at least partially splitting each extension, wherein a ratio of a length of a border of a split to a distance between two midpoints is no less than ⅓ and no greater than 3, each extension of said first pair and said second pair being split into first and second sub extensions by one of said slits, each of said pair of output terminal portions having first and second output terminal sub portions, said first output terminal sub portions being provided on said first sub extensions, said second output terminal sub portions being provided on said second sub extensions, one of said midpoints being a midway point equidistant from said first output terminal sub portions, the other of said midpoints being a midway point equidistant from said second output terminal sub portions, said length of a border of a split being a sum of a depth of a slit in one of said extensions multiplied by two and a width of a slit.

* * * * *

UNITED STATES PATENT AND TRADEMARK OFFICE
CERTIFICATE OF CORRECTION

PATENT NO. : 7,372,119 B2  Page 1 of 1
APPLICATION NO. : 10/491276
DATED : May 13, 2008
INVENTOR(S) : Masahiro Nakamura et al.

It is certified that error appears in the above-identified patent and that said Letters Patent is hereby corrected as shown below:

Claim 1, column 13, line 32, "death" should read --depth--.

Signed and Sealed this

Twenty-third Day of September, 2008

JON W. DUDAS
*Director of the United States Patent and Trademark Office*